(12) United States Patent  (10) Patent No.: US 6,297,088 B1
King  (45) Date of Patent: Oct. 2, 2001

(54) METHOD FOR FORMING A DEEP TRENCH CAPACITOR OF A DRAM CELL

(76) Inventor: Wei-Shang King, No. 19, Li Hsin Rd., Science-Based Industrial Park, Hsinchu (TW)

( * ) Notice: Subject to any disclaimer, the term of this patent is extended or adjusted under 35 U.S.C. 154(b) by 0 days.

(21) Appl. No.: 09/585,543

(22) Filed: Jun. 2, 2000

(30) Foreign Application Priority Data

Oct. 21, 1999 (TW) .............................................. 88118258

(51) Int. Cl.[7] .............................................. H01L 21/8242
(52) U.S. Cl. .......................... 438/243; 438/246; 438/386; 438/389
(58) Field of Search .................................. 438/243, 244, 438/245, 246, 386, 387, 388, 389

(56) References Cited

U.S. PATENT DOCUMENTS

| | | | |
|---|---|---|---|
| 6,008,104 | * | 12/1999 | Schrems ................................. 438/386 |
| 6,025,224 | * | 2/2000 | Gall et al. ............................. 438/243 |
| 6,100,130 | * | 8/2000 | Iba et al. ............................... 438/243 |
| 6,159,874 | * | 12/2000 | Tews et al. ........................... 438/246 |
| 6,204,140 | * | 3/2001 | Gruening et al. ................... 438/386 |

* cited by examiner

Primary Examiner—Trung Dang (57) ABSTRACT

A method of forming a DRAM cell with a trench capacitor over a semiconductor substrate comprises the following steps. First, an etching step is performed to form a trench structure in the substrate, wherein the trench structure has a bottom and sidewalls, and the sidewalls are adjacent to the bottom. And each the sidewall includes an upper sidewall adjacent to the substrate through a insulating layer and a lower sidewall adjacent to the substrate through a dielectric layer. Then, after the etching steps, a doped area is formed on the bottom and the lower sidewall for serving as the first electrode of the trench capacitor. A first conducting layer is formed on the doped area and the insulating layer above a portion of the upper sidewall to serve as a first capacitor electrode. Next, the dielectric layer is formed on an outer surface of the first conducting layer and a portion of the upper sidewalls, a second conducting layer is formed to fill into the trench structure for serving as a second capacitor electrode, wherein the second conducting layer being coupled electrically with a drain structure.

18 Claims, 5 Drawing Sheets

METHOD FOR FORMING A DEEP TRENCH CAPACITOR OF A DRAM CELL

RELATED APPLICATION

This application claims priority to Taiwan, R.O.C. Application No. 88118258 filed Oct. 21, 1999 which is herein incorporated by reference.

FIELD OF THE INVENTION

The present invention relates to a process for manufacturing a semiconductor device, and more specifically, to a process for manufacturing a deep trench for a Dynamic Random Access Memory (DRAM) cell.

BACKGROUND OF THE INVENTION

With the coming of Ultra Large Scale Integrated (ULSI) DRAM devices, the sizes of memory cells have gotten smaller and smaller such that the area available for a single memory cell has become very small. This causes reduction in capacitor area, resulting in the reduction of cell capacitance. Accordingly, for the memory cells in DRAM devices, the most important issue currently is how to promote the storage ability and operation stability of capacitors when the scales of devices still decreases and the integration increases. Thus, the susceptibility of capacitors due to α particle radiation and soft errors is lowered, and the increasing refresh frequency is improved.

For solving the issues above, the prior art approaches to overcome these problems have resulted in the development of the various types of capacitors, such as the trench capacitor and the stacked capacitor. However, the manufacture of the stacked capacitor causes difficulties due to the limitation of the lithography technique. Besides, enormous stacked structures for promoting storage capacity usually cause the crack of the stacked structure occurring due to the unequally stress. On the other hand, the storing capacity of trench capacitor can not be promoted effectively due to the scale of trench capacitor is restricted. In additional, the tunneling leakage is also an important issue for manufacturing the trench capacitors with the scale of trench capacitor smaller than micrometer.

Figure 1:
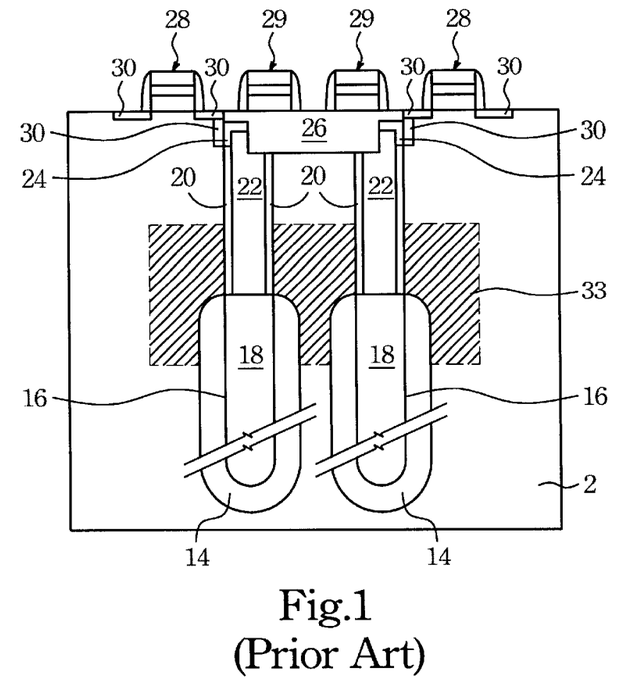
FIG. 1 is a cross sectional view of a semiconductor wafer illustrating the structures of the DRAM cell with a trench capacitor over a semiconductor substrate formed by the conventional technique.

In general, the structure of the typical trench capacitors is illustrated in FIG. 1. First, the trench structures are formed in the substrate 2 by performing the etching step. Then, the doped areas 14 which acts as the first electrodes of the capacitors are formed in the lower sidewalls and bottoms of the trench structures in the substrate 2 by performing the impurity diffusion procedure. Next, the first conducting layer 18, the second conducting layer 22 and the amorphous layer 24 are formed in the trench structures to serve as the second electrodes of the trench capacitors. The capacitor dielectric films 16 are formed between the first conducting layer 18 and the doped areas 14 above for serving as a dielectric layer of the capacitor. Similarly, the collar oxide layer 20 is used to separate the second conducting layer 22 from the substrate 2. Besides, the amorphous layer 24 is electrically connected to the source/drain areas 30 of the transistor 28 to perform the required operation. And the shallow trench insulators (STI) 26 are formed on the amorphous layer 24 to separate the amorphous layer 24 and transistor devices 28.

It is noted that the second conducting layer 22, the drains of the transistor devices 28 and buried N-well 33, as shown in FIG. 1, constitute a vertical transistor. The second conducting layer 22 acts as the gate of the vertical transistor, and the drains 30 and the buried N-well 33 are used to serve as the source/drain areas of the vertical transistor respectively. And the collar oxide layer 20 acts as a gate oxide. Referring to FIG. 1, wherein a portion of the upper sidewalls of the trenches acts as the channel of the vertical transistor. But in actual operation, the collar oxide layer 20 is maintained at a consistent value to prevent the leakage currents ascribed to the vertical device. Especially the leakage current issues are more frequently because the potential level of the second conducting layer 22 for serving as the gate of the vertical transistor is higher through the transistors 28 to a higher voltage $V_{cc}$. Thus for solving the leakage issues, the length of the collar oxide layer 20 is maintained to prevent forming the channels of the vertical devices for reducing the current leakage. Namely, the length of collar oxide layer 20 must be bigger than the predetermined limitation for defining the channel of the vertical transistor.

However, due to the length of the collar oxide layer 20 is limited by the design rules of the process window resulting that the trenches with higher aspect ratio can't used for the capacitors, the methods of increasing the depth of the trench structures are used to increase the surface areas of the doped areas 14 and to increase the capacitance. But with the increasing integration, the sizes of the trench structures are reduced mainly, and that causes the much difficulty happen in etching the trench to a enough predetermined depth, depositing the films and contacting layers into the trench structures for defining the various devices.

SUMMARY OF THE INVENTION

The prime objective of the present invention is to provide a method for manufacturing a deep trench capacitor for a DRAM cell.

The second objective of the present invention is to provide a method for enlarge the surface of the deep trench capacitor of the DRAM cell to a portion of the collar oxide layer.

The another objective of the present invention is to provide a method for increasing the surface of the trench capacitor by using the selectively etching methods for forming the bottle-shaped trench capacitor.

The further objective of the present invention is to increase the sruface of the trench capacitor by forming the amorphous films with the hemi-spherical grained (HSG) surface.

A method of forming a DRAM cell with a trench capacitor over a semiconductor substrate comprises the following steps. First an etching step is performed to form a trench structure in the substrate, wherein the trench structure has a bottom and sidewalls, and each sidewall includes an upper sidewall adjacent to the substrate through the insulating layer and a lower sidewall adjacent to the substrate through the dielectric layer. Next a first oxide layer is filled into the trench structure by using the CVD methods. And a blanket etchback step is performed to define the upper sidewalls of the trenchs. Subsequently a silicon oxide layer is formed on the upper sidewall by performing the thermal oxidation procedure. And silicon nitride layer is formed on the silicon oxide layer. After performing an isotropically etching to the silicon nitride layer, the collar structures are formed. Then, the first oxide layer is removed by using the HF solution for wet etching. A doped area is next formed on the bottom and the lower sidewall by performing the ion diffusion step for serving as the first electrode. A doped amorphous silicon (a-silicon) film is formed on the doped area and partial the collar nitride spacers. A second oxide layer is deposited to fill into the trench structure to define the areas which the doped a-silicon film covers the collar silicon nitride layer by performing an etching back procedure. The portion of doped a-silicon film exposed by the second silicon oxide layer is removed by $HNO_3$+HF solutions. Next the second silicon oxide layer is removed. A dielectric layer is next formed on the residual doped a-silicon film and a portion of the collar silicon nitride layer. And a conducting layer is filled into the trench structure for serving as the second storage electrode. Then, again the $HNO_3$+HF solution is used to etchback for the whole silicon materials for exposing the capacitor contacing layer defined in latter steps and the buried strap of the transistor devices. Before depositing the a-silicon layer for the buried strap, the $H_3PO_4$ at a higher temperature and HF solution are used to remove the collar silicon nitride layer and the thermal oxide layer in the BS area, then the a-silicon is deposited and etchback. A gate structure and active areas are formed above the substrate, and the drain/source (D/S) structures are formed adjacent to the gate structure. The beried strap is used to connect electrically the D/S structures and the conducting layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed hereinafter to promote the performance of the DRAM cells by increasing the surfaces of the capacitors, wherein the amorphous silicon film is formed on the doped areas (namely connecting to the first electrode) and the contacting layer is extended upwards along the surface of the collar silicon nitride layer. Relative to the second electrode (connecting to the transistor) used to act as the gate structure of the vertical transistor, the extending a-silicon film is used to act as the gate structure of the vertical transistor in the present invention to reduce the gate voltage. Thus, the leakage current issues are reduced effectively, and the process window is increased by using the method disclosed hereof. The detailed description is as follows.

Figure 2:
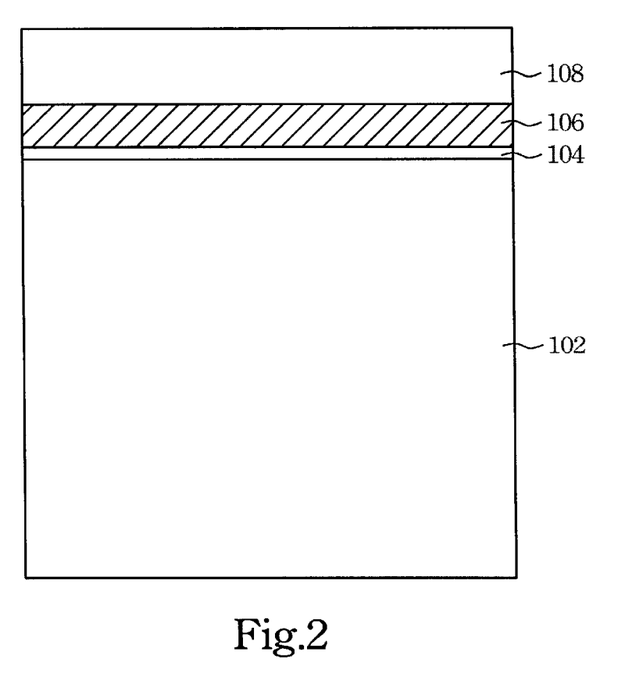
FIG. 2 is a cross sectional view of a semiconductor wafer illustrating the steps of forming a pad oxide layer, a nitride layer, and a thick oxide layer in accordance with the present invention.

Referring to FIG. 2, in the preferred embodiment, a silicon substrate 102 is provided with <100> crystallographic orientation. In general, various semiconducting materials, such as gallium arsenide, germanium or silicon on insulator (SOI) can be chosen to serve as the substrate 102. Besides, any other suitable orientation such as <110> or <111> is useful due to the surface property is not critical in the present invention. Next, a pad oxide layer 104 is formed on the substrate 102 by using a thermal oxidation. Then, a nitride layer 106 is formed on the pad oxide layer 104 to serve as a stopper of chemical mechanic polishing (such as the CMP process). In a preferred embodiment, the nitride layer 106 can be formed using Low Pressure Chemical Vapor Deposition (LPCVD), Plasma Enhance Chemical Vapor Deposition (PECVD), and so on. Further, the temperature forming the nitride layer 106 is at a range of 400–800° C. In the preferred embodiment, the reaction gases of the step to form nitride layer are $SiH_4$, $NH_3$, $N_2$, $N_2O$ or $SiH_2Cl_2$, $NH_3$, $N_2$, $N_2O$. Then, a thick silicon oxide layer 108 is formed on the nitride layer 106 to serve as a etching mask in latter steps. In a preferred embodiment, the thick silicon oxide layer 108 can be formed by using chemical vapor deposition (CVD) process, using TEOS as a source at a temperature between about 600 to 800° C., at a pressure 0.1 to 10 torrs.

Figure 3:
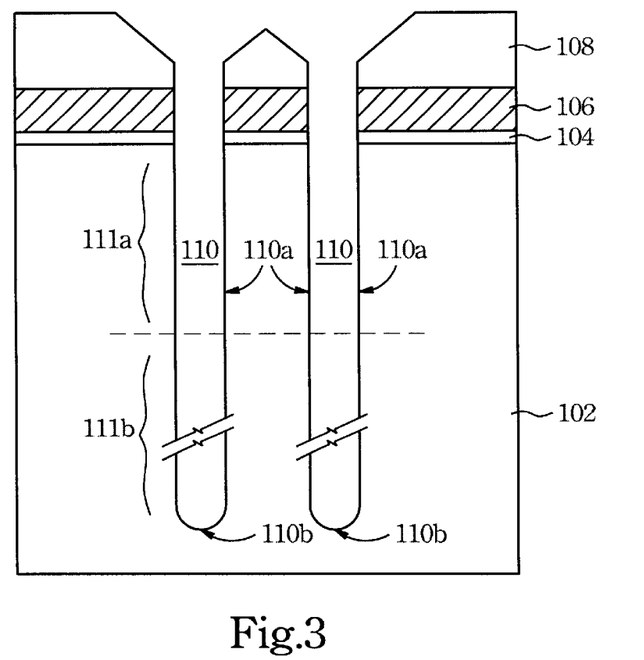
FIG. 3 is a cross sectional view of a semiconductor wafer illustrating the steps of forming a deep trench in accordance with the present invention.

Next, referring to FIG. 3, an etching step is performed to etch the oxide layer 108, the nitride layer 106 and the pad oxide layer 104 to expose the surface of a portion of substrate 102 for defining the trench pattern. An etching step is then performed to etch the exposed substrate 102 in order to form the trench structure 110 in the substrate 102. The trench structure 110 comprises the bottom 110b and the sidewalls 110a adjacent to the bottom 110b. And each sidewall can be divided into two portions including the lower sidewall 111b adjacent to the upper surface of the substrate, and the upper sidewall 111a adjacent to the bottom 110b. In a preferred embodiment, a reactive ion etching (RIE) step is used to form the trench structure 110, and the etchant used in this step can chosen from the group of $SiCl_4/Cl_2$, $BCl_3/Cl_2$, $HBr/Cl_2/O_2$, $HBr/O_2$, $Br_2/SF_6$ and $SF_6$. After the trench structure 110 is formed by using the etching step, the oxide layer 108 is removed by using the HF solution to performe the wet etching step, as shown in FIG. 4.

Figure 4:
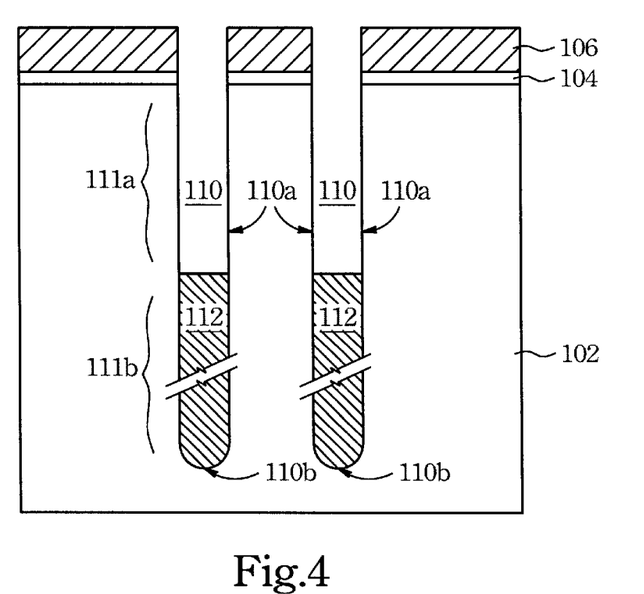
FIG. 4 is a cross sectional view of a semiconductor wafer illustrating the steps of forming an oxide layer into the deep trench structure in accordance with the present invention.

Then, referring to FIG. 4, after removing the thick oxide layer 108, a first oxide layer 112 is formed into a portion of the trench structure 110 by performing the chemically vapor deposition (CVD) method to cover the lower sidewalls 111b and the bottom 110b, and to expose the upper sidewalls 111a. In general, the first oxide layer is formed on the substrate 102 and into the whole trench structure 110 firstly. Then an etching back step is performed to remove the first oxide layer above the top surface of the substrate 102 and to remove a portion of the first oxide layer formed in the trench structure 110. Thus, the residual first oxide layer 112 used to cover the bottom 110b and the lower sidewalls 111b is as shown in FIG. 4.

It is noted that the step of dividing the sidewall 110a of the trench structure 110 into two portions including the lower sidewall 111b and the upper sidewall 111a is just convenient for the description and understanding about the present invention. And in actual manufacturing process, usually the first oxide layer 112, being etched back as illustrated in FIG. 4, is used to differentiate between the upper sidewall 111a exposed by the first oxide layer 112, and the lower sidewall 111b covered by the first oxide layer 112.

Figure 5:
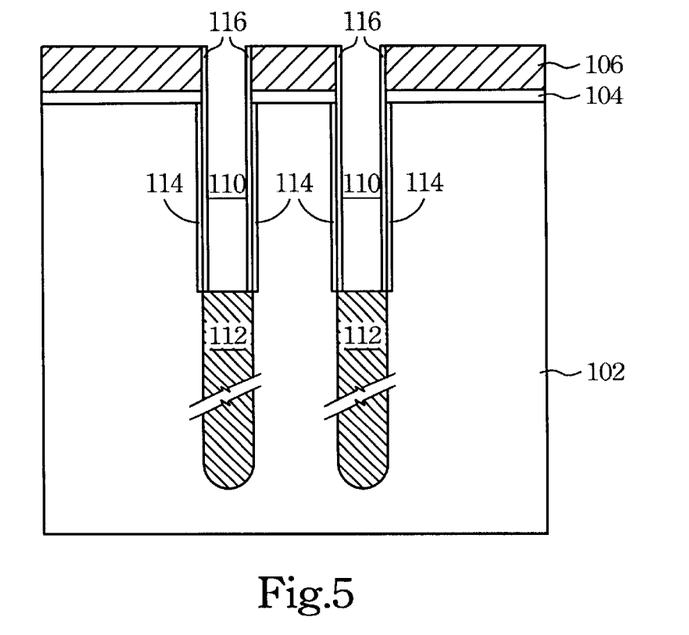
FIG. 5 is a cross sectional view of a semiconductor wafer illustrating the steps of forming the silicon oxide layer and the collar silicon nitride layer onto the sidewalls of the deep trench structure by performing an anisotropically etching procedure in accordance with the present invention.

Referring to FIG. 5, a thermal oxidation procedure is done to form a silicon oxide layer 114 on the upper sidewalls 111a of the trench structures 110. In the thermal oxidation procedure, the lower sidewalls 111b will not be oxidized because that is covered by the first oxide layer 112.

Then, collar nitride spacers 116 are formed on the outer surface of the silicon oxide layer 114, and formed on the sidewalls of the pad oxide layer 104 and the nitride layer 106. In a preferred embodiment, a nitride layer is formed firstly on the substrate 102 along the surface of the trench structures 110. Namely, the nitride layer is formed on the outer surfaces of the nitride layer 106, the pad oxide layer 104, the silicon oxide layer 114 and the first oxide layer 112. Next, an anisotropical etching procedure is performed to remove the nitride layer formed above the nitride layer 106 and the first oxide layer 112. Thus, the collar nitride spacers 116 is formed on the sidewalls of the nitride layer 106 and the pad oxide layer 104, and on the surface of the silicon oxide layer 114 as shown in FIG. 5.

Figure 6:
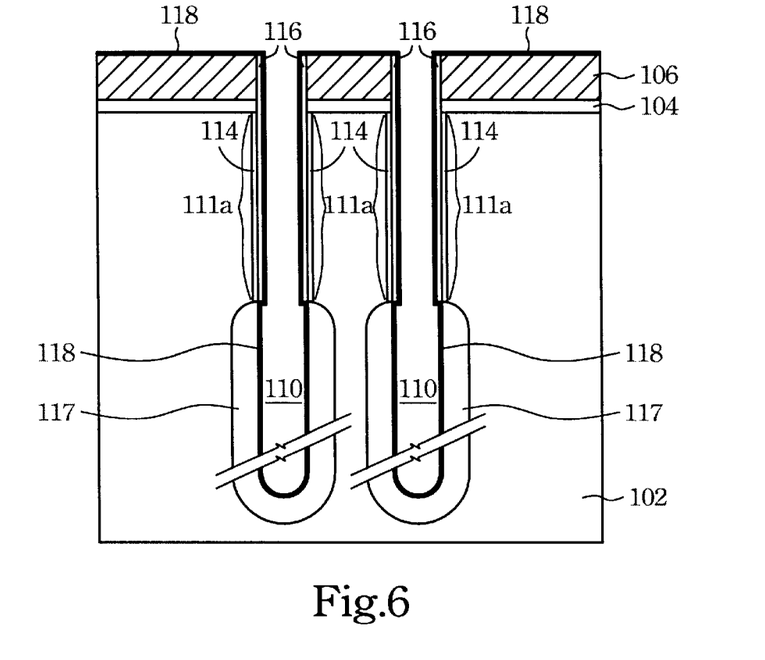
FIG. 6 is a cross sectional view of a semiconductor wafer illustrating the steps of forming the doped areas and the doped a-silicon layer in the deep trench structure in accordance with the present invention.

Then, as illustrated in FIG. 6, the first oxide layer 112 in the trench structures 110 is removed by performing an etching step. It is noted that the collar nitride spacers 116 are used to serve as an etching stopper for preventing the silicon oxide layer 114 being etched in the etching step. Besides, the collar nitride spacers 116 are also used to prevent the pad oxide layer 104 between the nitride layer 106 and the substrate 102 from being etched in the etching step. In a preferred embodiment, the HF solutions, the BOE (buffer oxide etching) solutions or the other likes can be used to remove the first oxide layer 112.

Then, an implanting procedure is done to form the doped areas 117 in the bottom 110b and the lower sidewalls 111b of the trench structures 110. The dopant can not be implanted into the upper sidewalls 111a adjacent to the top surface of the substrate 102 due to the upper sidewalls 111a are covered by the collar nitride spacers 116. Namely the collar nitride spacers 116 is used to serve as a barrier layer in the implanting procedure for preventing the dopant implanting into the upper sidewalls 111a.

In addition, in a preferred embodiment, before forming the doped areas 117, an selectively etching step is optionally performed to wet etch the lower sidewalls 111b of the substrate. A selective etching procedure with the high etching selectivity of silicon material (lower sidewalls 111b) to silicon nitride (collar nitride spacers 116 and the silicon nitride layer 106), by using the recipe comprising the $HNO_3$ and HF, can be used to remove the portion of the lower sidewalls 111b. Namely the collar nitride spacers 116 can be used to serve as the etching stopper for preventing the upper sidewalls 111a of the trench structures 110 being etched in the etching step. Thus, after the etching step, the doped areas 117 are formed by performing the ion diffusion procedure on the residual lower sidewalls 111b to serve as the first electrode of the trench capacitor manufactured in latter steps. It is noted that the trench structures 110 have the bottle shape profile after performing the above etching step. And that causes the surface areas of the doped areas 117 increase mainly. Therefore, the capacitance of the capacitor will be promoted effectively.

Still referring to FIG. 6, an amorphous silicon (a-silicon) film 118 is formed on the doped areas 117, the collar nitride spacers 116 and the nitride layer 106. Typically, the a-silicon film 118 can be formed of in-situ doped a-silicon or doped a-silicon. The doped a-silicon film 118 is as the first electrode due to covering and connecting to the doped areas 117.

In a preferred embodiment, a plurality of hemi-spherical silicon grains (HSG) are optionally formed onto the doped a-silicon film 118 to increase the surface areas of the doped a-silicon film 118 serving as the first electrode. In an embodiment, the silicon nuclei are seeded on the a-silicon film by using the silicon containing gases such as the $SiH_4$ or $Si_2H_6$ at a temperature about 500 to 600° C., and at a pressure about $10^{-3}$ to $10^{-5}$ torrs. Next, an annealing step is performed to the substrate 102 in a highly vacuumed environment at a temperature about 500 to 600° C. and a pressure about $10^{-7}$ to $10^{-9}$ torrs for forming the hemi-spherical grains on the doped a-silicon film 118.

Figure 7:
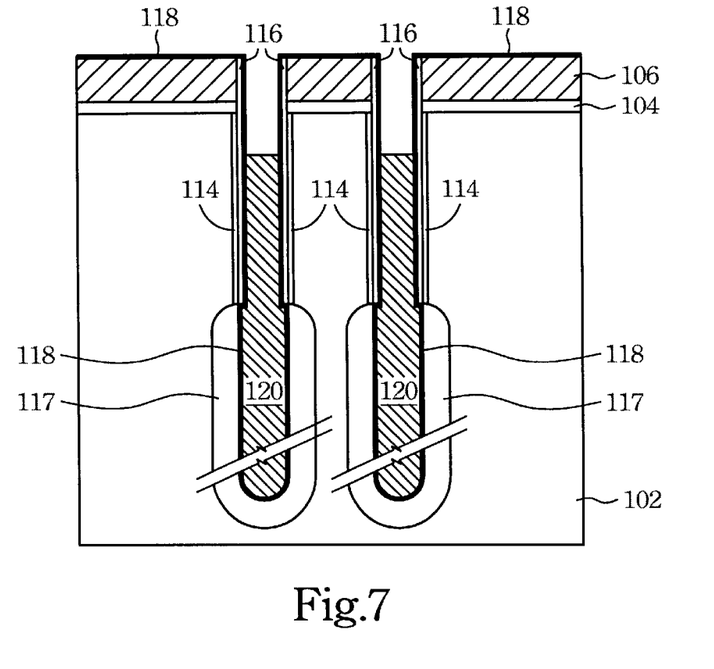
FIG. 7 is a cross sectional view of a semiconductor wafer illustrating the steps of forming the oxide layer to define the pattern of the a-silicon layer in accordance with the present invention.

Next, as illustrated in FIG. 7, a second oxide layer 120 is formed by performing the chemically vapor deposition (CVD) to fill into a portion of the trench structures 110 to cover the doped a-silicon film 118, and to expose a portion of the doped a-silicon film 118 formed on the collar nitride spacers 116. The upper surface of the second oxide layer 120 is lower than the upper surface of the substrate 102. Thus, the portion of the doped a-silicon film 118 formed above the upper sidewalls 111a is exposed, and the doped a-silicon film 118 formed above the outer surfaces of the nitride layer 106 and the pad oxide layer 104 is exposed too. In general, the second oxide layer is formed on the substrate 102 and filled into the trench structures 110 firstly. Then an etching back step is performed to remove a portion of second oxide layer to form the residual second oxide layer 120 in the trench structures 110 as shown in FIG. 7.

Figure 8:
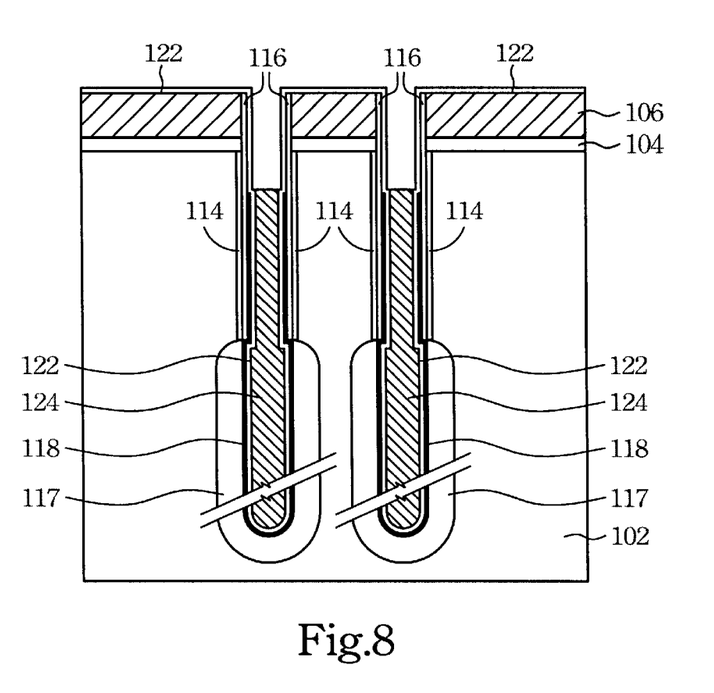
FIG. 8 is a cross sectional view of a semiconductor wafer illustrating the steps of forming a conducting layer into the deep trench to serve as the second electrode in accordance with the present invention.

Next, referring to FIG. 8, the exposed doped a-silicon film 118 is removed firstly. Namely the doped a-silicon film 118 that is not covered by the second oxide layer 120 is removed to expose a portion of the collar nitride spacers 116 and to expose the surface of the nitride layer 106. After removing the portion of the doped a-silicon film 118, the second oxide layer 120 in the trench structures 110 is also removed. Thus, the residual doped a-silicon film 118 on the doped areas 117 and a portion of the collar nitride spacers 116 is exposed. As described above, in the step of removing the second oxide layer 120, the collar nitride spacers 116 are used to serve as the etching stopper to prevent the silicon oxide layer 114 beneath thereof being etched.

Then, still referring to FIG. 8, a capacitor dielectric film 122 is formed along the surface of the trench structures 110. Namely the capacitor dielectric film 122 is formed on the outer surfaces of the doped a-silicon film 118, the collar nitride spacers 116 and the nitride layer 106. The capacitor dielectric film 122 is preferably formed of either a double film of nitride/oxide film or a triple film of oxide/nitride/oxide. A conducting layer 124 is then formed to fill into the trench structures 110 to serve as the second electrode. Typically, the conducting layer is formed on the substrate 102 and filled into the trench structures 110. Then an etching back step is done to remove the conducting layer above the substrate 102, and to remove a portion of the conducting layer in the trench structures 110. Thus, the residual conducting layer 124 is formed as shown in FIG. 8. The upper surface of the conducting layer 124 is lower than the upper surface of the substrate 102. And a portion of the capacitor dielectric film 122 above the sidewalls of the silicon oxide layer 114 and the collar nitride spacers 116. In general, the conducting layer 124 is formed of doped a-silicon or in-situ doped a-silicon.

Figure 9:
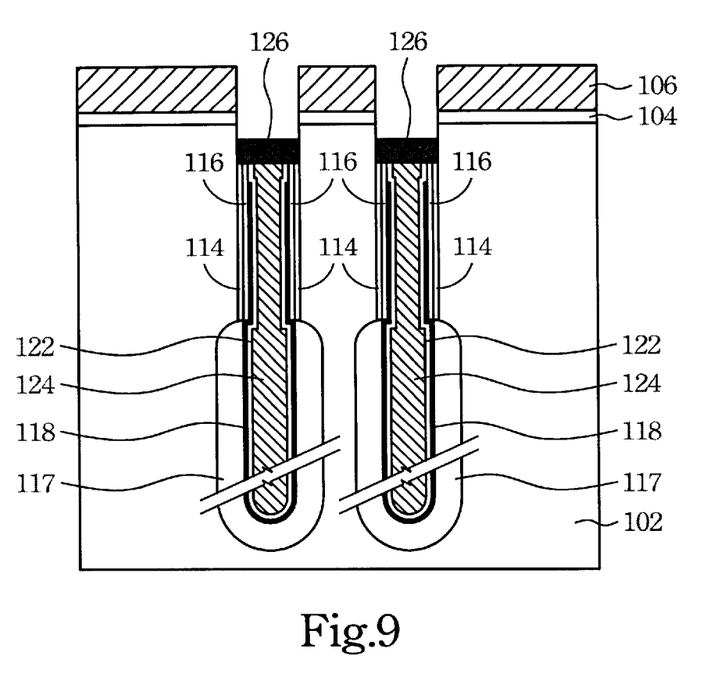
FIG. 9 is a cross sectional view of a semiconductor wafer illustrating the steps of forming an a-silicon layer onto the conducting layer in accordance with the present invention.

Next, referring to FIG. 9, the capacitor dielectric film 122, the collar silicon nitride spacers 1 16 and the silicon oxide layer 114 that are not covered by the conducting layer 124 are removed in sequence. First the portion of the capacitor dielectric film 122 that is not covered by the conducting layer 124 is removed. The exposed collar nitride spacers are then removed. Next the exposed silicon oxide layer by the conducting layer 124 is removed also. Therefore, portions of the sidewalls 110a of the trench structures 110 that are adjacent to the upper surface of the substrate 102 are exposed.

Subsequently, an a-silicon layer 126 is formed above the conducting layer 124, the collar nitride spacers 116, the capacitor dielectric film 122 and the silicon oxide layer 114 in the trench structures 110. The top surface of the a-silicon layer 126 is below that of the substrate 102. In general, as described above, an a-silicon layer is formed on the substrate 102 and filled into the trench structures 110 firstly. Then, an etching back step is done to remove the a-silicon layer above the substrate 102 to form the a-silicon layer 126 as shown in FIG. 9. Besides, the a-silicon layer 126 can also be formed of doped a-silicon or in-situ doped a-silicon.

Figure 10:
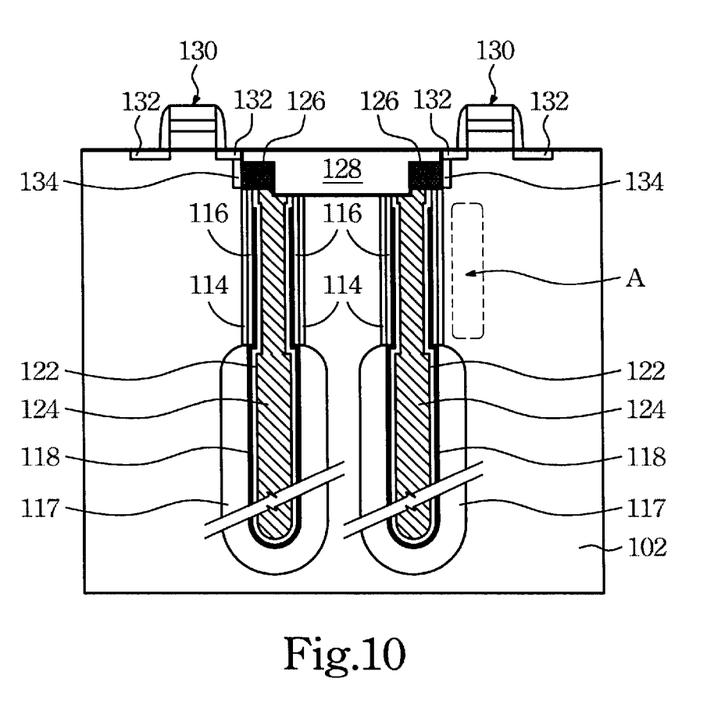
FIG. 10 is a cross sectional view of a semiconductor wafer illustrating the steps of forming the DRAM cell with the deep trench structure in accordance with the present invention.

Then, refer to FIG. 10, a shallow trench insulator (STI) structure 128 is formed on the substrate 102 by using the well known techniques to define the active area on the substrate 102. It is noted that the STI structure 128 is used to cover above the conducting layer 124 and the doped a-silicon layer 126 in order to insulate the storage electrode and the wordlines formed in latter steps. Then, the gates 130 are formed in sequence by using the well known art. Next, a doping step is performed to form the drain/source areas 132 by using the gate 130 as a mask. A strap region 134 is used to connect electrically the doped a-silicon layer 126 and the source/drain areas 132. In a preferred embodiment, a thermal anneal step is performed to diffuse the dopants in the a-silicon layer 126 into the strap region 134 as shown in FIG. 10.

The method provided in the present invention has many advantages. First, the surface areas of the manufactured capacitors and capacitance are increased mainly due to the trench structures with the bottle shape profile by using the selective etching step to remove a portion of the doped areas in the trench structures. Second, the surface area of the first electrode of the capacitor is also increased by forming the doped a-silicon film on the doped areas, wherein the doped a-silicon film is formed to extend upwards along the collar nitride spacers. It is noted that the extending doped a-silicon film on the collar nitride layer can be used to serve as the gate structure of the vertical transistor for replacing the second electrode used to be the gate thereof in prior art. Especially the doped a-silicon film 118 (please refer to FIG. 10) is electrically connected to the doped areas 117 that acts the first electrode. That can cause the potential level of the doped a-silicon film is only about half of that of the second electrode, wherein the second electrode is connected to transistor above the substrate. So for the structure of the DRAM cell shown in FIG. 10, the current leakage probability between the buried-N well and the strap areas 134 (also comprising the source/drain areas 132) can be reduced effectively because the potential level of the gate of the vertical transistor is decreasing. Thus, the length of the area used to serve as the channel between the buried-N well and the strap areas 134 can be decreased mainly. Namely by using the process provided in the present invention the length of the collar insulating layer 116 and 114 can be decreased too. And the process window limited by the prior design rule can be promoted effectively. Thus following the decreasing of the collar insulating layer 116 and 114, the doped areas 117 can extend upward to increase the surface areas and the electron storage capability.

Besides, the extending doped a-silicon film 118 along the collar nitride spacers 1 16 upward can also be used to increase the surface areas of the first electrode. Especially as described above, the hemi-spherical grains are formed onto the doped a-silicon film for increasing the areas thereof, and for promoting the capacitance of the manufactured capacitor.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a trench capacitor for a DRAM cell over a semiconductor substrate, said method comprises the following steps of:

etching said substrate to form a trench structure in said substrate, wherein said trench structure has a bottom and sidewalls adjacent to said bottom, and each said sidewall including an upper sidewall adjacent to an upper surface of said substrate and a lower sidewall adjacent to said bottom;

doping said trench structure to form a doped area on said bottom and said lower sidewall for serving as the first electrode of said trench capacitor;

forming a first conducting layer on said doped area and a portion of said upper sidewall adjacent to said lower sidewall;

forming a dielectric layer on a outer surface of said first conducting layer and said sidewalls; and forming a second conducting layer to fill into said trench structure, wherein said second conducting layer being coupled electrically with a drain structure.

2. The method of claim 1, further comprises the following steps before etching said substrate to form said trench structure:

forming a pad oxide layer on said substrate;

forming a nitride layer on said pad oxide layer; and forming a hard mask layer on said nitride layer.

3. The method of claim 1, further comprises the following steps before forming said doped area on said lower sidewall and said bottom:

performing a thermal oxidation procedure to form a silicon oxide layer onto said upper sidewall; and forming collar nitride spacers on said silicon oxide layer to cover said silicon oxide layer.

4. The method of claim 1, wherein said first conducting layer is made of amorphous silicon (a-silicon).

5. The method of claim 1, further comprises the step of performing a selective etching to remove a portion of said doped area with the etchant comprising of $HNO_3$ and HF after forming said doped area.

6. The method of claim 1, further comprises the step of forming hemi-spherical silicon grains onto a surface of said first conducting layer after forming said first conducting layer.

7. The method of claim 1, wherein said dielectric layer being chosen from a group of O/N and O/N/O.

8. The method of claim 1, wherein said second conducting layer is formed by in-situ doped a-silicon.

9. The method of claim 1, wherein said first conducting layer is connected to said doped area and extended upwards along a collar nitride spacers for serving as a gate of a vertical transistor and increasing the area of said first electrode.

10. A method of forming a trench capacitor for a DRAM cell over a semiconductor substrate, said method comprises the following steps of:

forming a mask layer on said substrate;

etching said mask layer to expose a portion of a surface of said substrate for defining the trench pattern;

etching said substrate to form a trench structure in said substrate by using said mask layer to be an etching mask, wherein said trench structure has a bottom and sidewalls adjacent to said bottom, and each said sidewall including an upper sidewall adjacent to an upper surface of said substrate and a lower sidewall adjacent to said bottom;

forming a first oxide layer by performing a CVD method to fill into a portion of said trench structure to cover said bottom and said lower sidewall, and to expose said upper sidewall;

forming silicon oxide layer on said upper sidewall by performing a thermal oxidation procedure;

forming collar nitride spacers on the outer surface of said silicon oxide layer;

removing said first oxide layer in said trench structure;

doping said trench structure to form a doped area on said bottom and said lower sidewall for serving as the first electrode of said trench capacitor;

forming a doped amorphous silicon (a-silicon) film on said doped area and a portion of said collar nitride spacers;

forming a second oxide layer to fill into said trench structure for exposing a portion of said doped a-silicon film adjacent to the upper surface of said substrate;

removing said portion of said doped a-silicon film exposed by said second oxide layer to expose said collar nitride spacers;

removing said second oxide layer in said trench structure to expose said residual doped a-silicon film;

forming a dielectric layer on said residual doped a-silicon film;

forming a conducting layer to fill into said trench structure for serving as the second storage electrode of said trench capacitor;

forming a gate structure above said substrate;

forming drain/source (D/S) structures by performing a doping step by using said gate structure to be a mask; and using a strap region to couple electrically said D/S structures and said conducting layer.

11. The method of claim 10, wherein said mask layer being made of oxide.

12. The method of claim 10, wherein said doped a-silicon film is connected to said doped area and extended upwards along said collar nitride spacers for increasing the area of said first electrode.

13. The method of claim 10, wherein said doped a-silicon film extending upwards along said collar nitride spacers is used to serve as a gate of a vertical transistor, wherein the drain/source areas of said vertical transistor comprise said strap area and said doped area.

14. The method of claim 10, further comprises the step of performing a selective etching for said lower sidewall before forming said doped area for increasing the surface area of said doped area.

15. The method of claim 14, wherein said selective etching step is performed by using the etchant comprising of $HNO_3$ and HF.

16. The method of claim 10, wherein said dielectric layer being chosen from a group of N/O and O/N/O.

17. The method of claim 10, wherein said conducting layer is formed by in-situ doped a-silicon.

18. The method of claim 10, further comprises the step of forming hemi-spherical silicon grains (HSG) on said doped a-silicon film after forming said doped a-silicon film.

* * * * *